United States Patent
Takahashi

(10) Patent No.: US 6,400,222 B1
(45) Date of Patent: Jun. 4, 2002

(54) LINEARIZER

(75) Inventor: Kazutoshi Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/594,931

(22) Filed: Jun. 15, 2000

(30) Foreign Application Priority Data

Jun. 17, 1999 (JP) ............................................ 11-171283

(51) Int. Cl.[7] ................................................. H03F 1/26
(52) U.S. Cl. ........................................ 330/149; 330/145
(58) Field of Search ................................... 330/144, 145, 330/149, 284, 277

(56) References Cited

U.S. PATENT DOCUMENTS 3,810,035 A * 5/1974 Gundry ................... 330/145 X
5,038,113 A * 8/1991 Katz et al. ................... 330/277

OTHER PUBLICATIONS

The Institute of Electronics Information and Communication Engineers, Technical Report of IEICE ED94–146 NW94–133, ICD94–208 (1995–01) K. Morie et al, pp. 25–29, A Minaturized GaAs FET Linearizer with a Feedback Element.

* cited by examiner

Primary Examiner—Steven J. Mottola
(74) Attorney, Agent, or Firm—Rosenman & Colin LLP

(57) ABSTRACT

A linearizer is provided which is capable of scaling its circuit down and making it lightweight, of lowering power consumption and of facilitating an input-output calibration. The linearizer is so configured that a first resistor is connected in series to a second resistor, a third resistor is connected to a connecting point between the first and second resistors, an FET (Field Effect Transistor) as a variable resistance element is connected to the third resistor, an inductor is connected between the FET and a GND, and the first, second and third resistors and the FET constitute a T-type attenuator.

22 Claims, 5 Drawing Sheets

LINEARIZER

BACKGROUND OF THE INVENTION

1. Field of the Invention

The present invention relates to a linearizer and more particularly to the linearizer connected to a front stage of a compensated circuit and is capable of compensating for an input-output characteristic of the compensated circuit.

2. Description of the Related Art

As mobile communication equipment operating in a microwave frequency band such as a portable communication device, satellite communication device or a like is widely used in recent years, a low distortion characteristic, in particular, is becoming a must of a high-frequency amplifier employed in such mobile communication equipment. However, since the high-frequency amplifier of this type exhibits a non-linear characteristic that, as an input power approaches a saturation region level, a gain is decreased and a passing phase turns to its positive side (the phase leads), it is difficult to achieve the low distortion characteristic in the high-frequency amplifier. A metal semiconductor transistor (MES) composed of a compound semiconductor, which is a kind of Field Effect Transistor (FET) and can provide a high speed operation and highly efficient operation in a high frequency region, is widely employed as an amplifying device constituting the high-frequency amplifier.

In order to achieve the low distortion characteristic in the high frequency amplifier, conventionally, nonlinearity of the high frequency amplifier is compensated for by connecting a compensating circuit. The compensating circuit, linearizer, exhibits a characteristic being approximately opposite to that described above that, as the input power approaches the saturation region level, the gain is increased and the passing phase turns to its negative side (the phase lags), in the, front stage of the high frequency amplifier.

FIG. 6 is a diagram explaining a principle in which the nonlinearity of the conventional high-frequency amplifier (a compensated circuit) is compensated for by the linearizer (a compensating circuit). A linearizer 60 is connected to the front stage of a high-frequency amplifier 50 which uses an FET 51 as the amplifying device. The FET 51 is used in a source-grounded manner in which its source electrode 51S is connected to ground (GND). To a gate electrode 51G is connected a gate resistor 53 which is also connected to a gate power source 52 (supplying, for example, −0.2 V to −0.1V). To a drain electrode 51D is connected an inductor 55 which is also connected to a drain power source 54(supplying, for example, +5.0V to +7.0V).

FIG. 7A is a diagram explaining a principle in which the nonlinearity of the high-frequency amplifier 50 is compensated for by the linearizer 60 in FIG. 6. As shown in FIG. 7A, the high-frequency amplifier 50 exhibits a characteristic that, as an input power Pin (on a horizontal axis) approaches the saturation region level, a gain G is decreased.

Therefore, by connecting the linearizer 60 exhibiting a characteristic that as the input power Pin approaches the saturation region level as shown in FIG. 7B, the gain G is increased, in the front stage of the high-frequency amplifier 50, its synthetic gain characteristic becomes approximately linear as shown in FIG. 7C.

FIGS. 8A, 8B and 8C are diagrams explaining a principle in which the nonlinearity of the high-frequency amplifier 50 is compensated for by the linearizer 60. FIG. 8A shows that, in the high-frequency amplifier 50, as the input power Pin approaches the saturation region level, the passing phase P turns to its positive side. Therefore, by connecting the linearizer 60 exhibiting a characteristic that the input power Pin approaches the saturation region level as shown in FIG. 8B, the passing phase turns to its negative side; in the front stage of the high-frequency amplifier 50, its synthetic gain characteristic becomes linear as shown in FIG. 8C. This allows the nonlinearity of the high-frequency amplifier 50 serving as the compensated circuit to be compensated for by the linearizer 60 serving as the compensating circuit. This also serves to achieve the low distortion of the high-frequency amplifier 50.

The conventional linearizer 60 has configurations as shown in FIG. 5, which is disclosed in a report "A simple-type linearizer loaded with a feedback device using a GaAsFET (Gallium Arsenide Field Effect Transistor)" ("Technical Report" issued by "The Institute of Electronic Information and Communication Engineers", MW94-133, IDC94-208, 1995-01). In the linearizer 60 shown in FIG. 5, a source-grounded type FET 40 is used, a gate electrode 40G of which is used as an input terminal, a drain electrode 40D of which is used as an output terminal and an inductor 41 is connected between a source electrode 40S and a GND. In the linearizer 60, by operating the FET 40 as an active element to obtain the nonlinearity in mutual conductance "gm" and drain conductance "gd" in the non-linear region and by utilizing the inductor 41, a gain is increased as its input power approaches a saturation region level and its passing phase is made to lag, which can compensate for the nonlinearity of the high-frequency amplifier 50 in its latter stage.

However, the conventional linearizer 60 described in the above literature has a problem in that the use of the FET 40 as the active element causes power consumption. That is, in the conventional linearizer 60, since the nonlinearity of the mutual conductance "gm" and drain conductance "gd" in the non-linear region is obtained by operating the FET 40 as the active element, it cannot prevent power consumption causing a low rate of using a power source.

Furthermore, the above linearizer 60 presents a problem in that, since it has a bad input-output impedance and since its input-output impedance is changed greatly due to the input power level, a degradation in its reflection characteristic occurs. As a result, a connection of a matching circuit such as an isolating circuit or a like to its input-output terminal is required, causing a larger circuit scale. This causes not only difficulties in scaling down a circuit embedded with the linearizer 60 and high-frequency amplifier 50 and in making it lightweight but also a rise in costs caused by a calibration between circuits.

SUMMARY OF THE INVENTION

In view of the above, it is an object of the present invention to provide a linearizer capable of scaling its circuit down and making it lightweight, of lowering its power consumption and of facilitating an input-output calibration.

According to a first aspect of the present invention, there is provided a linearizer for compensating for a characteristic of a compensated circuit, having a characteristic being approximately opposite to an input-output characteristic of the compensated circuit and being connected to a front stage of the compensated circuit, including:

a reactance element connected between one terminal of a variable resistance element and a GND; and a T-type attenuator whose shunt is connected to an other terminal of the variable resistance element.

According to a second aspect of the present invention, there is provided a linearizer for compensating for a characteristic of a compensated circuit, having a characteristic being approximately opposite to an input-output characteristic of the compensated circuit and being connected to a front stage of the compensated circuit, including:

a reactance element connected between one terminal of a variable resistance element and a GND; and a π-type attenuator whose shunt is connected to an other terminal of the variable resistance element.

According to a third aspect of the present invention, there is provided a linearizer for compensating for a characteristic of a compensated circuit, having a characteristic being approximately opposite to an input-output characteristic of the compensated circuit and being connected to a front stage of the compensated circuit, including:

first and second resistors each being connected in series;

a third resistor connected to a connecting point between the first and second resistors;

a variable resistance element connected to the third resistor;

a reactance element connected between the variable resistance element and a GND; and whereby a non-connecting terminal of the first resistor is used as an input terminal and a non-connecting terminal of the second resistor is used as an output terminal.

According to a fourth aspect of the present invention, there is provided a linearizer for compensating for a characteristic of a compensated circuit, having a characteristic being approximately opposite to an input-output characteristic of the compensated circuit and being connected to a front stage of the compensated circuit, including:

a first resistor connected in parallel to both second resistor and third resistor each being connected in series to each other;

a variable resistance element connected to a connecting point between the first resistor and the second resistor;

a reactance element connected between the variable resistance element and a GND; and whereby one terminal of the first resistor is used as an input terminal and an other terminal of the first resistor is used as an output terminal.

In the foregoing, a preferable mode is one wherein the variable resistance element is composed of a non-linear device.

Also, a preferable mode is one wherein a reactance element is connected between the non-linear device and the GND.

Also, a preferable mode is one wherein a metal semiconductor transistor is used as the non-linear device.

Furthermore, a preferable mode is one wherein a bias voltage being large enough to cause the metal semiconductor transistor to operate in a saturation region is applied to a gate electrode of the metal semiconductor transistor and a nonlinearity obtained while the metal semiconductor transistor is operated is utilized.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
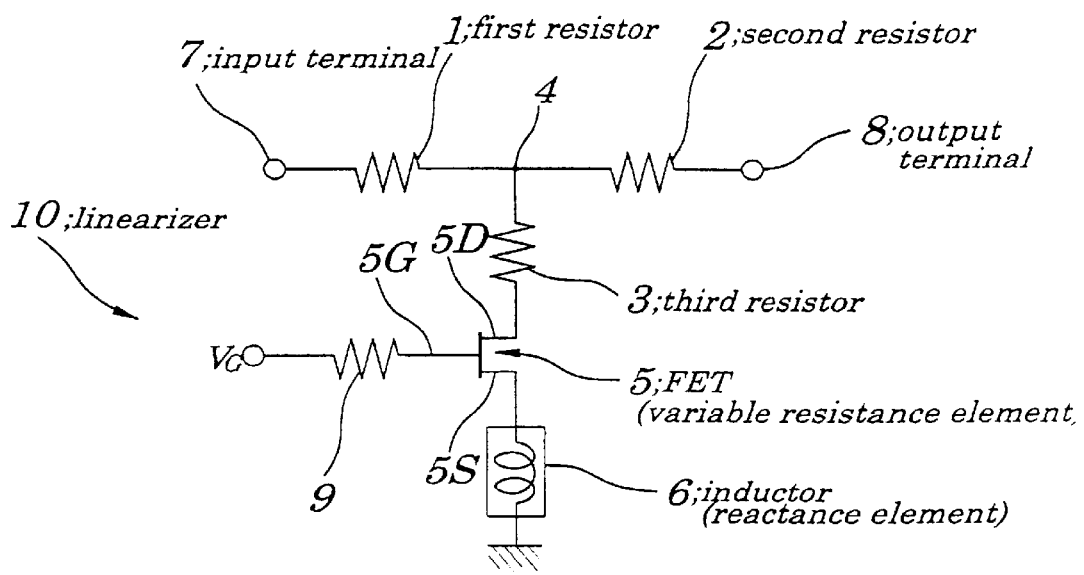
FIG. 1 is a schematic circuit diagram showing configurations of a linearizer according to a first embodiment of the present invention.
Figure 2:
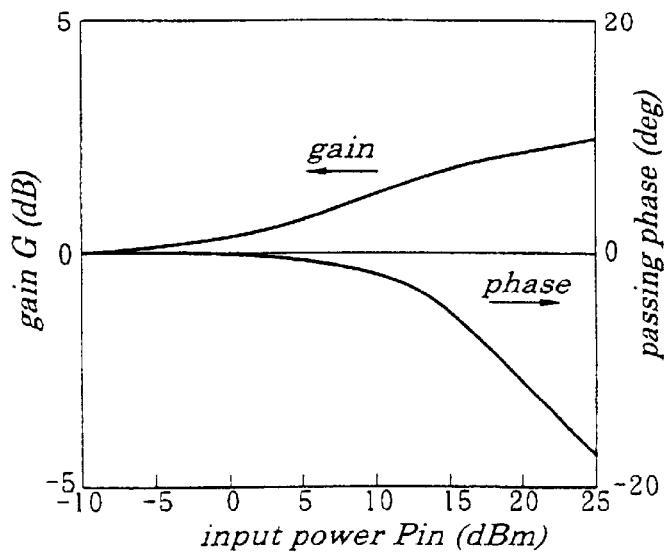
FIG. 2 is a diagram showing an input-output characteristic obtained by the linearizer according to the first embodiment of the present invention.
Figure 3:
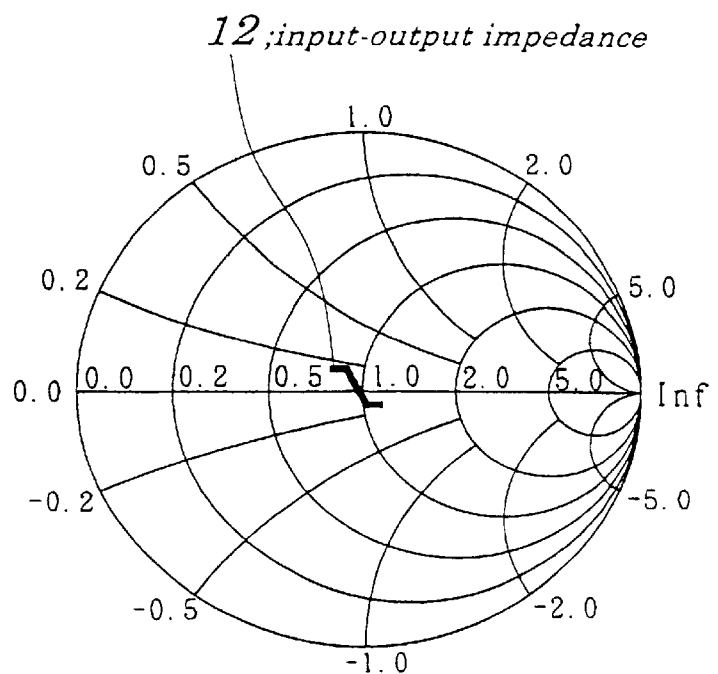
FIG. 3 is a diagram showing a reflection loss characteristic obtained by the linearizer according to the first embodiment of the present invention.

FIG. 1 is a schematic circuit diagram showing configurations of a linearizer according to a first embodiment of the present invention. FIG. 2 is a diagram showing an input-output characteristic obtained by the linearizer according to the first embodiment. FIG. 3 is a diagram showing a reflection loss characteristic obtained by the linearizer according to the first embodiment. As shown in FIG. 1, in a linearizer 10, a first resistor 1 is connected to a second resistor 2 in series, a third resistor 3 is connected to a connecting point 4 of the first and second resistors 1 and 2, an FET 5 is connected to the third resistor 3 as a variable resistance element, an inductor 6 as a reactance element is connected between the FET 5 and a GND and a non-connecting terminal of the first resistor 1 and a non-connecting terminal of the second resistor 2 are used as an input terminal 7 and an output terminal 8 respectively. A metal semiconductor transistor (MES) composed of a compound semiconductor that can provide a high speed operation and highly efficient operation in a high-frequency field is used as the FET 5.

In the above linearizer 10, the first resistor 1, second resistor 2 and third resistor 3 and FET 5 constitute a T-type attenuator, and the FET 5 is connected to a shunt of this T-type attenuator. Thus, in the above linearizer 10, since the T-type attenuator is constituted, an excellent reflection characteristic is obtained and the reflection characteristic against a change in an input power level is made small.

To a gate electrode 5G through a gate resistor 9 is applied a gate bias voltage vg which is large enough to cause the FET5 to operate most suitably in a saturation region, so that the FET 5 is used as an element to exhibit nonlinearity. A resistance value R1 of the first and second resistors 1 and 2 and a resistance value R2 of the third resistor 3 and the gate bias voltage Vg are set within the following ranges:

R1: 10Ω to 20Ω

R2: 0.01Ω to 100Ω

Vg: 0v to −1 v

Moreover, a gate width wg of the FET 5 is set from 50 μm to 400 μm.

By setting the gate bias voltage Vg of the FET 5 to the above ranges, the FET 5 can be operated most suitably in the saturation region. Since an internal resistance of the FET 5 increases in the saturation region, a shunt resistance of the T-type attenuator composed of the FET 5 is also increased. As a result, since a passing loss is reduced (a gain increases), the gain increases when the input power level is raised.

That is, if the input power is at a low level, a signal inputted into the input terminal 7, after being attenuated by an amount attenuated based on the resistance value R1 of the first resistor 1 and second resistor 2 and on the internal resistance of the FET 5, is outputted to the output terminal 8. At this point, the gain becomes constant. However, as the input power increases and approaches the saturation region of the FET 5, the internal resistance increases due to the nonlinearity of the FET 5. Generally, since the amount of the attenuation decreases if the resistance value R1 of the through circuit of the attenuator is constant and the shunt resistance (the resistance value R2 and internal resistance of the FET) increases, a characteristic can be obtained that the gain increases with the increase in the internal resistance of the FET 5 induced by the increase in the input power.

On the other hand, a passing phase lags (turns to a negative side) since the internal resistance of the FET 5 is increased and the passing phase is changed corresponding to a change in the input power. That is, the passing phase turns to the negative side due to the nonlinearity of mutual conductance gm and a capacity Cgs between a gate and a source.

Moreover, since an impedance between the connecting point 4 to connect the first resistor 1 with the second resistor 2 and the GND is changed by changing the inductor 6 used as the reactance element, it is possible to adjust an amount of the distortion (including the increase in the gain and lagging of the passing phase).

Furthermore, since the impedance that can reduce the reflection is defined by the resistance value R1 of the first resistor 1, resistance value R1 of the second resistor 2 and resistance value R2 of the third resistor 3 and by the internal resistance, a favorable impedance value can be obtained by setting these resistances within a suitable range. Also, since the FET 5 is used as a passive element and a voltage Vds between the drain and the source is set to 0 (Zero), power consumption can be lowered so as to measure about 0 (zero).

FIG. 2 shows a result from a simulation of an input-output characteristic of the linearizer 10 implemented in the embodiment. In FIG. 2, a left axis represents a gain G and a right axis represents a passing phase P. As is apparent from FIG. 2, a characteristic can be obtained that, as an input power approaches a saturation region level, the gain G increases and that the passing phase P turns to its negative side. Therefore, by connecting the linearizer 10 to a front stage of the high-frequency amplifier serving an compensated circuit, since the nonlinearity of the high-frequency amplifier can be compensated for, a low distortion property of the high-frequency can be easily achieved.

FIG. 3 shows a result from a simulation of a reflection loss characteristic of the linearizer 10 implemented in the embodiment. In FIG. 3, the reflection loss characteristic corresponding to the input power level is plotted on a Smith chart. An input-output impedance portion 12 is plotted in a center position of the Smith chart being indicative that an excellent reflection loss characteristic can be obtained.

Moreover, the characteristics shown in FIGS. 2 and 3 are obtained under the following setting conditions:

R1: 16Ω
R2: 6Ω
Vg: −0.5 v
Wg: 100 μm

Thus, according to configurations of the linearizer 10 of the embodiment, since the first resistor 1 is connected in series to the second resistor 2, the third resistor 3 is connected to the connecting point 4 between the first resistor 1 and the second resistor 2, the FET 5 as the variable resistance element is connected to the third resistor 3, the inductor 6 as the reactance element is connected between the FET 5 and the GND and the first, second and third resistors 1, 2 and 3 and the FET 5 constitute the T-type attenuator, the nonlinearity of the compensated circuit can be compensated for even by small-sized circuit configurations. Therefore, it is possible to make the above circuit small-sized and lightweight, to lower the power consumption and to easily make an input-output calibration.

Second Embodiment

Figure 4:
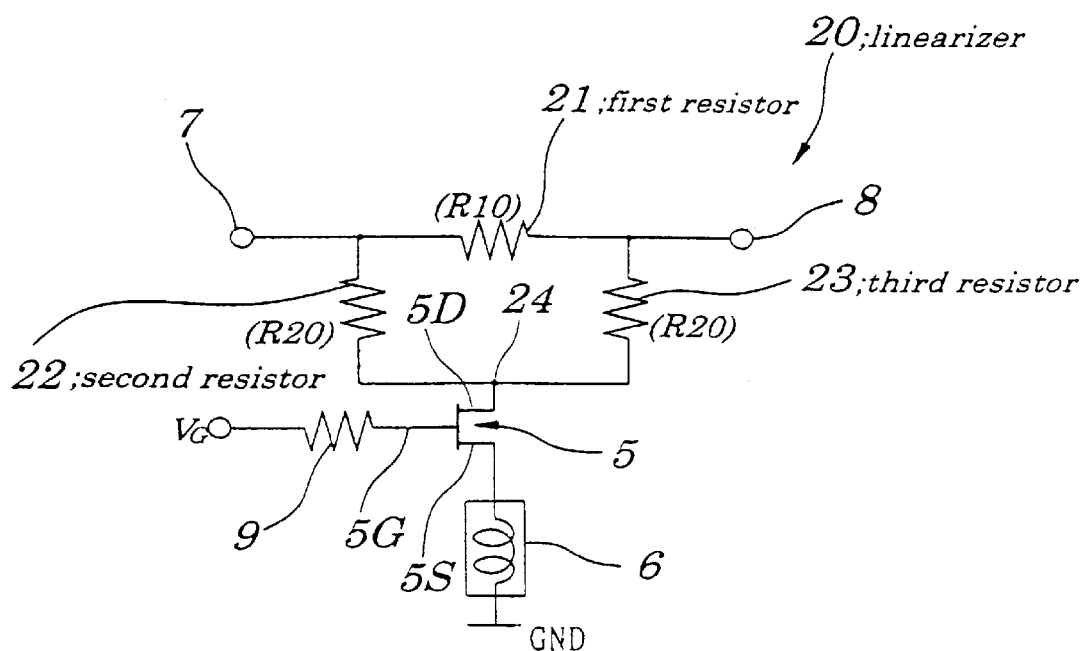
FIG. 4 is a schematic circuit diagram showing configurations of a linearizer according to a second embodiment of the present invention.
Figure 5:
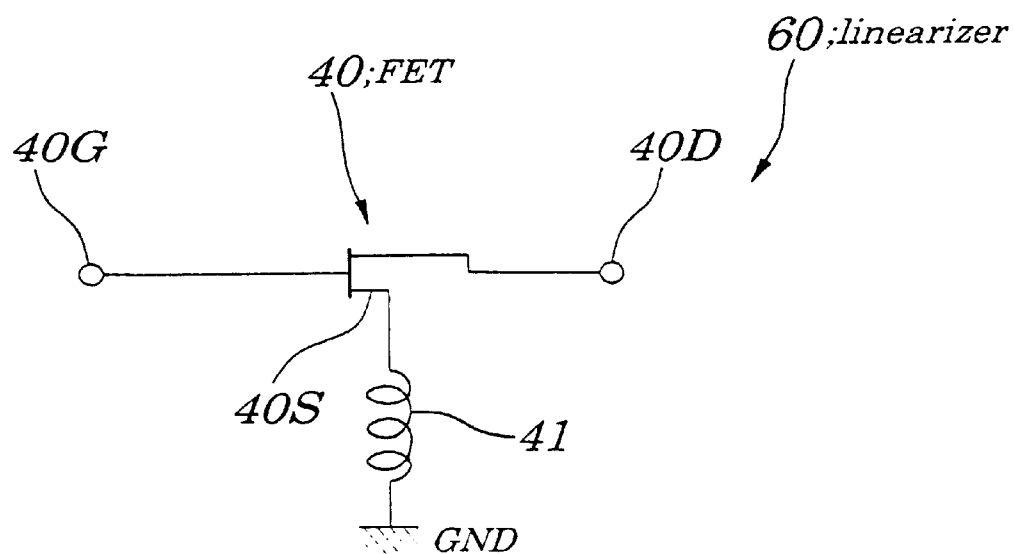
FIG. 5 is a schematic diagram showing configurations of a conventional linearizer.
Figure 6:
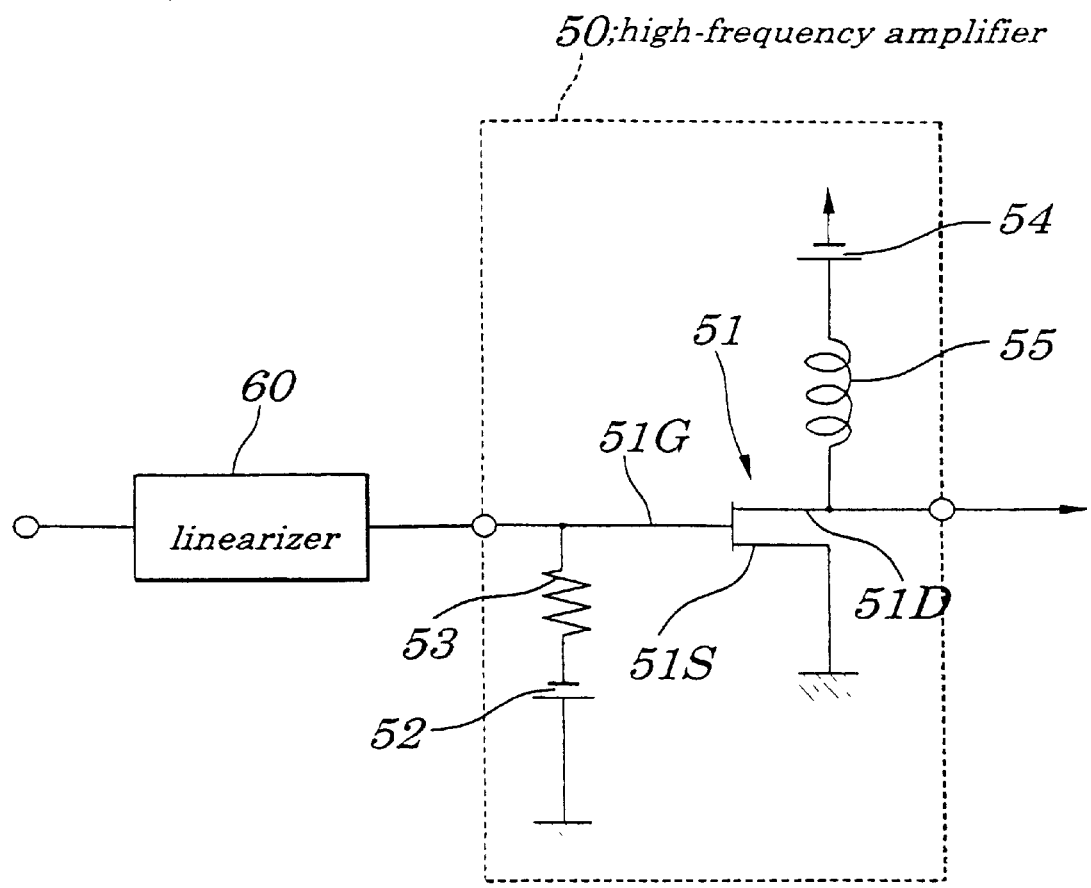
FIG. 6 is a schematic block diagram explaining a principle in which nonlinearity of a conventional high-frequency amplifier is compensated for by the conventional linearizer.
Figure 7A:
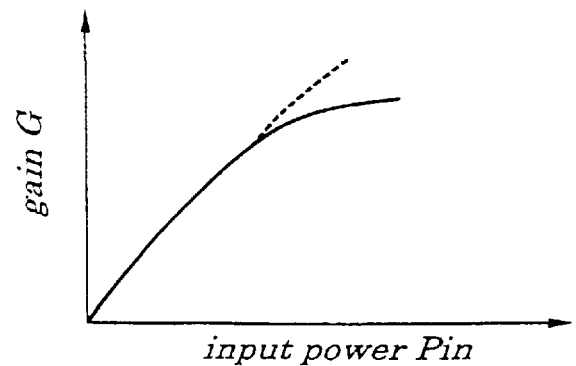
FIGS. 7A, 7B and 7C are diagrams explaining a principle in which nonlinearity of the conventional high-frequency amplifier is compensated for by the conventional linearizer as in the conventional example shown in FIG. 6.
Figure 7B:
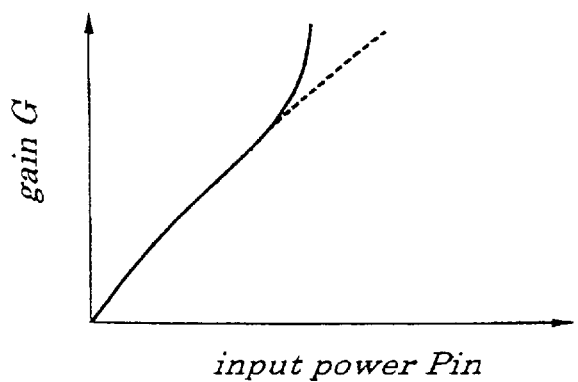
Figure 7C:
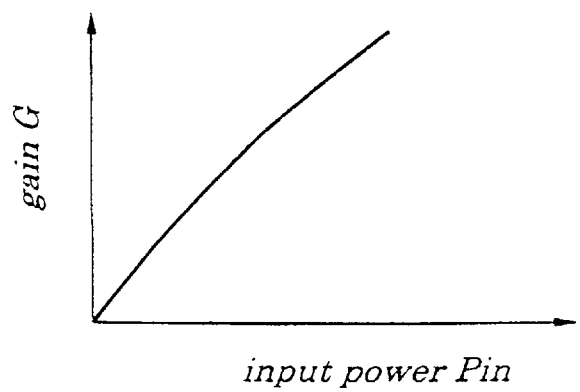
Figure 8A:
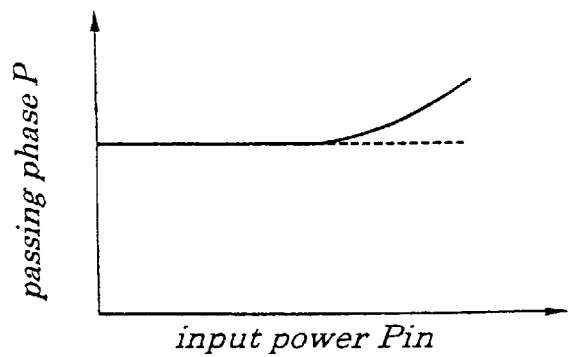
FIGS. 8A, 8B and 8C are diagrams explaining a principle in which nonlinearity of the conventional high-frequency amplifier is compensated for by the conventional linearizer as in the conventional example shown in FIG. 6.
Figure 8B:
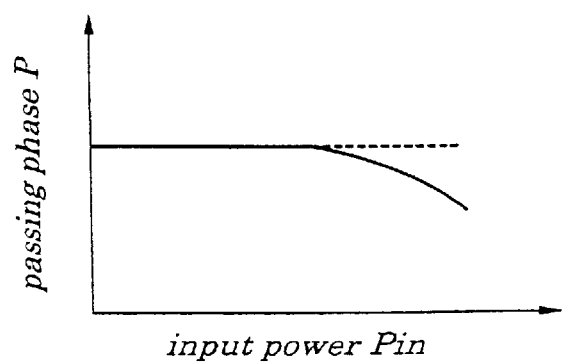
Figure 8C:
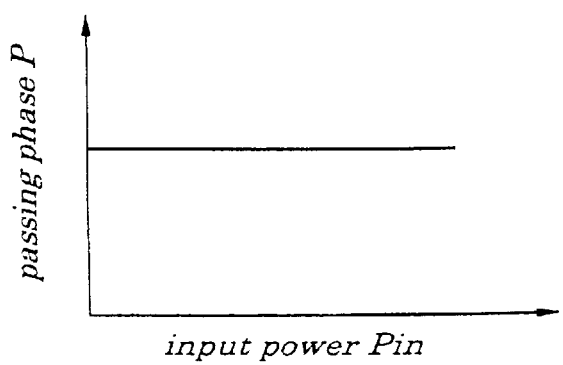

FIG. 4 is a schematic circuit diagram showing configurations of a linearizer 20 according to a second embodiment of the present invention. Configurations of the linearizer 20 of the second embodiment differ greatly from those of the first embodiment in that a π-type attenuator is constituted in the second embodiment. As shown in FIG. 4, in the linearizer 20 according to the second embodiment, since a second resistor 22 and third resistor 23 each being connected in series are connected in parallel to a first resistor 21, an FET 5 as a variable resistance element is connected to a connecting point 24 between the second resistor 22 and the third resistor 23, an inductor 6 as a reactance element is connected between the FET 5 and a GND and both terminals of the first resistor 21 are used as an input terminal 7 and an output terminal 8 respectively. Moreover, in the above linearizer 20, the first resistor 21, second resistor 22 and third resistor 23 and the FET 5 constitute the π-type attenuator, and the FET 5 is connected to a shunt of this π-type attenuator.

In the above linearizer 20, a resistance value R10 of the first resistor 21, a resistance value R20 of the second resistor 22 and third resistor 23 and a gate bias voltage Vg are set within the following ranges:

R10: 20Ω to 50Ω
R20: 100Ω to 200Ω
Vg: 0 v to −1 v
Wg: 50 μm to 400 μm

By setting the gate bias voltage Vg of the FET 5 within the range described above, it is possible for the linearizer 20 to perform approximately a same operation as in the case of the first embodiment. Therefore, in the second embodiment, approximately same characteristics as shown in the diagrams showing input-output characteristics in FIG. 2 and showing reflection loss characteristics in FIG. 3 according to the first embodiment can be obtained.

Configurations of the linearizer 20 of the second embodiment are the same as those of the first embodiment except points described above and, therefore, the same reference numbers shown in FIG. 4 designate corresponding parts shown in FIG. 1 and descriptions of them are omitted.

Thus, by configuring the linearizer 20 as provided in the second embodiment, the same effects as obtained in the first embodiment can be achieved accordingly.

As described above according to the linearizes of the present invention, since the first resistor and second resistor are connected in series, the third resistor is connected to the connecting point between the first and second resistors, the variable resistance element is connected to the third resistor, the reactance element is connected between the variable resistance element and the GND and since the first, second and third resistors and the FET constitute the T-type attenuator, the nonlinearity of the compensated circuit can be compensated for even by small-sized circuit configurations.

Moreover, as described above, according to the linearizer of the present invention, the variable resistance element is connected to the connecting point between the second and third resistors, the reactance element is connected between the variable resistance element and the GND and since the first, second and third resistors and the FET constitute the π-type attenuator, the nonlinearity of the compensated circuit can be compensated for even by small-sized circuit configurations. Therefore, according to the present invention, the circuit of the linearizer can be made small-sized and lightweight and is capable of preventing increased power consumption and of facilitating its input-output calibration.

It is apparent that the present invention is not limited to the above embodiments but may be changed and modified without departing from the scope and spirit of the invention. For example, the variable resistance element is not limited to the FET, and non-linear devices such as a bipolar transistor, diode or a like may be used as the variable resistance. Moreover, the reactance element is not limited to the inductor, and other non-linear devices may be used as the reactance element.

Finally, the present application claims the priority of Japanese Patent Application No. Hei11-171283 filed on Jun. 17, 1999, which is herein incorporated by reference.

What is claimed is:

1. A linearizer for compensating for a characteristic of a compensated circuit, having a characteristic being approximately opposite to an input-output characteristic of said compensated circuit and being connected to a front stage of said compensated circuit, comprising:
   a reactance element connected between one terminal of a variable resistance element and a GND, no resistive element being connected between said one terminal of said variable resistance element and said GND; and
   a T-type attenuator whose shunt is connected to an other terminal of said variable resistance element.

2. The linearizer according to claim 1, wherein said variable resistance element is composed of a non-linear device.

3. The linearizer according to claim 2, wherein a reactance element is connected between said non-linear device and said GND.

4. The linearizer according to claim 2, wherein a metal semiconductor transistor is used as said non-linear device.

5. The linearizer according to claim 4, wherein a bias voltage being large enough to cause said metal semiconductor transistor to operate in a saturation region is applied to a gate electrode of said metal semiconductor transistor and nonlinearity obtained while said metal semiconductor transistor is operated is utilized.

6. A linearizer for compensating for a characteristic of a compensated circuit, having a characteristic being approximately opposite to an input-output characteristic of said compensated circuit and being connected to a front stage of said compensated circuit, comprising:
   a reactance element connected between one terminal of a variable resistance element and a GND, no resistive element being connected between said one terminal of said variable resistance element and said GND; and
   a π-type attenuator whose shunt is connected to an other terminal of said variable resistance element.

7. The linearizer according to claim 6, wherein said variable resistance element is composed of a non-linear device.

8. The linearizer according to claim 7, wherein a reactance element is connected between said non-linear device and said GND.

9. The linearizer according to claim 7, wherein a metal semiconductor transistor is used as said non-linear device.

10. The linearizer according to claim 9, wherein a bias voltage being large enough to cause said metal semiconductor transistor to operate in a saturation region is applied to a gate electrode of said metal semiconductor transistor and nonlinearity obtained while said metal semiconductor transistor is operated is utilized.

11. A linearizer for compensating for a characteristic of a compensated circuit, having a characteristic being approximately opposite to an input-output characteristic of said compensated circuit and being connected to a front stage of said compensated circuit, comprising:
    first and second resistors each being connected in series;
    a third resistor connected to a connecting point between said first and second resistors;
    a variable resistance element connected to said third resistor;
    a reactance element connected between said variable resistance element and a GND (ground); and
    whereby a non-connecting terminal of said first resistor is used as an input terminal and a non-connecting terminal of said second resistor is used as an output terminal.

12. The linearizer according to claim 11, wherein said variable resistance element is composed of a non-linear device.

13. The linearizer according to claim 12, wherein a reactance element is connected between said non-linear device and said GND.

14. The linearizer according to claim 12, wherein a metal semiconductor transistor is used as said non-linear device.

15. The linearizer according to claim 14, wherein a bias voltage being large enough to cause said metal semiconductor transistor to operate in a saturation region is applied to a gate electrode of said metal semiconductor transistor and nonlinearity obtained while said metal semiconductor transistor is operated is utilized.

16. A linearizer for compensating for a characteristic of a compensated circuit, having a characteristic being approximately opposite to an input-output characteristic of said compensated circuit and being connected to a front stage of said compensated circuit, comprising;
    a first resistor connected in parallel to both second resistor and third resistor each being connected in series to each other;
    a variable resistance element connected to a connecting point between said third resistor and said second resistor;
    a reactance element connected between said variable resistance element and a GND; and
    whereby one terminal of said first resistor is used as an input terminal and an other terminal of said first resister is used as an output terminal.

17. The linearizer according to claim 16, wherein said variable resistance element is composed of a non-linear device.

18. The linearizer according to claim 17, wherein a reactance element is connected between said non-linear device and said GND.

19. The linearizer according to claim 17, wherein a metal semiconductor transistor is used as said non-linear device.

20. The linearizer according to claim 19, wherein a bias voltage being large enough to cause said metal semiconductor transistor to operate in a saturation region is applied to a gate electrode of said metal semiconductor transistor and nonlinearity obtained while said metal semiconductor transistor is operated is utilized.

21. A linearizer for compensating for a characteristic of a compensated circuit, having a characteristic being approximately opposite to an input-output characteristic of said compensated circuit and being connected to a front stage of said compensated circuit, comprising:

a reactance element connected between a source/drain of a field effect transistor as a variable resistance element and a GND; and A T-type attenuator whose shunt is connected to a drain/source of said field effect transistor.

22. A linearizer for compensating for a characteristic of a compensated circuit, having a characteristic being approximately opposite to an input-output characteristic of said compensated circuit and being connected to a front stage of said compensated circuit, comprising:

a reactance element connected between a source/drain of a field effect transistor as a variable resistance element and a GND; and a π-type attenuator whose shunt is connected to a drain/source of said field effect transistor.

* * * * *